(12) United States Patent
Henzler et al.

(10) Patent No.: US 12,399,523 B2
(45) Date of Patent: Aug. 26, 2025

(54) WIRELESS CIRCUITRY WITH TIME ALIGNED DATA STREAMS

(71) Applicant: Apple Inc., Cupertino, CA (US)

(72) Inventors: Stephan Henzler, Munich (DE); Alexander Klinkan, Linz (AT)

(73) Assignee: Apple Inc., Cupertino, CA (US)

( * ) Notice: Subject to any disclaimer, the term of this patent is extended or adjusted under 35 U.S.C. 154(b) by 346 days.

(21) Appl. No.: 18/156,952

(22) Filed: Jan. 19, 2023

(65) Prior Publication Data
US 2024/0248509 A1    Jul. 25, 2024

(51) Int. Cl.
*G06F 1/10* (2006.01)
*G06F 1/06* (2006.01)
*H03K 3/037* (2006.01)

(52) U.S. Cl.
CPC .............. *G06F 1/10* (2013.01); *G06F 1/06* (2013.01); *H03K 3/037* (2013.01)

(58) Field of Classification Search
None
See application file for complete search history.

(56) References Cited

U.S. PATENT DOCUMENTS

| | | | |
|---|---|---|---|
| 6,922,109 B2 | 7/2005 | Fallahi et al. | |
| 8,918,666 B2 | 12/2014 | Bauernfeind et al. | |
| 10,056,924 B2 | 8/2018 | Schafferer et al. | |
| 10,305,504 B1 | 5/2019 | Azenkot et al. | |
| 10,541,658 B2 * | 1/2020 | Zai | H03F 3/68 |
| 10,698,441 B2 * | 6/2020 | Cali | G06F 1/08 |
| 2007/0275676 A1 | 11/2007 | Rofougaran et al. | |
| 2008/0198957 A1 * | 8/2008 | Kowatari | G01R 31/318357 375/360 |
| 2018/0191368 A1 * | 7/2018 | Lye | H03F 1/02 |

FOREIGN PATENT DOCUMENTS

WO    2018075121 A1    4/2018

* cited by examiner

*Primary Examiner* — Paul Yen
(74) *Attorney, Agent, or Firm* — Treyz Law Group, P.C.; Jason Tsai (57) ABSTRACT

A radio-frequency amplifier can have a radio-frequency input configured to receive a radio-frequency signal and a control input for receiving a control signal. The radio-frequency signal can be generated using a first group of digital-to-analog converters (DACs), whereas the control signal can be generated using a second set of DACs. Data intended for the first group of DACs can be fed through a first set of retiming circuits and a first crossbar circuit. Data intended for the second group of DACs can be fed through a second set of retiming circuits and a second crossbar circuit. A low skew clocking interface and constant latency control and clock domain cross circuits can be employed to ensure that data streams arriving at the first group of DACs are time aligned with data streams arriving at the second group of DACs.

20 Claims, 7 Drawing Sheets

WIRELESS CIRCUITRY WITH TIME ALIGNED DATA STREAMS

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Radio-frequency signals transmitted by an antenna can be fed through one or more power amplifiers, which are configured to amplify low power analog signals to higher power signals more suitable for transmission through the air over long distances. A radio-frequency power amplifier can receive a radio-frequency signal and a control signal. If care is not taken, the radio-frequency signal and the control signal arriving at the power amplifier may not be temporally aligned and can degrade the performance of the power amplifier.

SUMMARY

An electronic device may include wireless communications circuitry. The wireless communications circuitry can include one or more processors or signal processing blocks for generating baseband signals, a transceiver for receiving the digital signals and for generating corresponding radio-frequency signals, and one or more radio-frequency amplifiers configured to amplify the radio-frequency signals for transmission by one or more antennas in the electronic device. A radio-frequency amplifier can receive a radio-frequency signal and a control signal.

An aspect of the disclosure provides circuitry that includes a first digital-to-analog converter (DAC), a second digital-to-analog converter (DAC), a first data latch configured to receive a first data stream and to receive a first clock signal via a first clock tree, a second data latch configured to receive a second data stream and to receive a second clock signal via a second clock tree, clocking interface circuitry coupled between the first data latch and the first DAC and coupled between the second data latch and the second DAC, the clocking interface circuitry having a plurality of registers each of which is configured to receive a reference clock signal, a first constant latency control (CLC) and clock domain crossing (CDC) circuit coupled between the clocking interface circuitry and the first DAC, and a second constant latency control (CLC) and clock domain crossing (CDC) circuit coupled between the clocking interface circuitry and the second DAC.

The radio-frequency amplifier can have a radio-frequency input coupled to the first DAC and a control input coupled to the second DAC. The circuitry can further include a third clock tree configured to receive a clock source and to output the reference clock signal to the clocking interface circuitry, the third clock tree having fewer clock buffer stages than the first clock tree and having fewer clock buffer stages than the second clock tree. The first and/or second CLC and CDC circuit can be configured to receive the reference clock signal from the clocking interface circuitry, to receive the first data stream from one of the registers in the clocking interface circuitry, and to generate an interpolated output signal using an output clock signal that is delayed by a constant time offset with respect to the reference clock signal. The constant time offset can be independent of the frequency and phase of the output clock signal.

An aspect of the disclosure provides wireless circuitry that includes a first digital-to-analog converter (DAC) coupled to a first input of the radio-frequency amplifier, a second digital-to-analog converter (DAC) coupled to a second input of the radio-frequency amplifier, a first constant latency control (CLC) subcircuit coupled to an input of the first DAC, and a second constant latency control (CLC) subcircuit coupled to an input of the second DAC. The wireless circuitry can further include a first clock domain crossing (CDC) subcircuit coupled to the first CLC subcircuit and a second clock domain crossing (CDC) subcircuit coupled to the second CLC subcircuit. The wireless circuitry can further include a layer of registers controlled by a reference clock signal and having outputs coupled to the first and second CLC subcircuits, where the first and second CLC subcircuits are configured to receive the reference clock signal. The wireless circuitry can further include a first crossbar circuit coupled to a first portion of the registers, a second crossbar circuit coupled to a second portion of the registers, and a clock tree configured to output the reference clock signal to the layer of registers.

An aspect of the disclosure provides wireless circuitry that includes a first group of data sources, a second group of data sources, data latching and retiming circuitry configured to receive first data streams from the first group of data sources and to receive second data streams from the second group of data sources, multiplexing circuitry configured to receive signals from the data latching and retiming circuitry, a layer of registers configured to receive signals from the multiplexing circuitry and a reference clock signal, a first group of constant latency control (CLC) and clock domain crossing (CDC) circuits configured to receive signals from a first portion of the registers, the reference clock signal, and an output clock signal, and a second group of constant latency control (CLC) and clock domain crossing (CDC) circuits configured to receive signals from a second portion of the registers, the reference clock signal, and the output clock signal. The wireless circuitry can further include a first group of digital-to-analog converters (DACs) coupled to the first group of CLC and CDC circuits and coupled to a radio-frequency input of the RF amplifier and a second group of digital-to-analog converters (DACs) coupled to the second group of CLC and CDC circuits and coupled to a control input of the RF amplifier.

DETAILED DESCRIPTION

Figure 1:
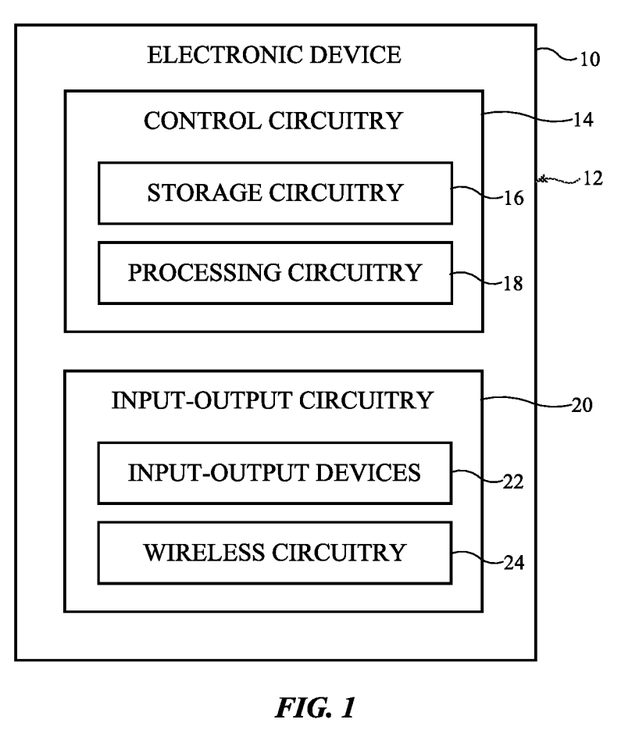
FIG. 1 is a diagram of an illustrative electronic device having wireless circuitry in accordance with some embodiments.

An electronic device such as device 10 of FIG. 1 may be provided with wireless circuitry. The wireless circuitry may include a processor for generating baseband signals, an upconversion circuit for upconverting (mixing) the baseband signals into radio-frequency signals, a radio-frequency amplifier for amplifying the radio-frequency signals, and an antenna for radiating the amplified radio-frequency signals.

The radio-frequency power amplifier can have a radio-frequency input configured to receive a radio-frequency signal and a control input for receiving a control signal. In some embodiments, the control signal can be a variable supply voltage generated using an envelope tracking circuit. In other embodiments, the control signal can be used to tune an adjustable load component of the amplifier. The radio-frequency signal can be generated using a first set of digital-to-analog converters (DACs), whereas the control signal can be generated using a second set of digital-to-analog converters (DACs).

Digital data streams intended for the first set of DACs can be fed through a first set of clock networks, a first set of retiming circuits, and a first crossbar circuit. Digital data streams intended for the second set of DACs can be fed through a second set of clock networks, a second set of retiming circuits, and a second crossbar circuit. A first set of constant latency control (CLC) and clock domain crossing (CDC) circuits can be interposed between the first crossbar circuit and the first set of DACs. A second set of constant latency control (CLC) and clock domain crossing (CDC) circuits can be interposed between the second crossbar circuit and the second set of DACs. A low clock skew interface can be further interposed between the crossbar circuits and the two sets of CLC and CDC circuits to ensure that the data streams being conveyed to the two sets of DACs are synchronized using a low skew reference clock. Configured and operated in this way, any potential timing shift between digital data streams arriving at the first set of DACs and digital data streams arriving at the second set of DACs that is caused by temperature and voltage variations can be mitigated.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
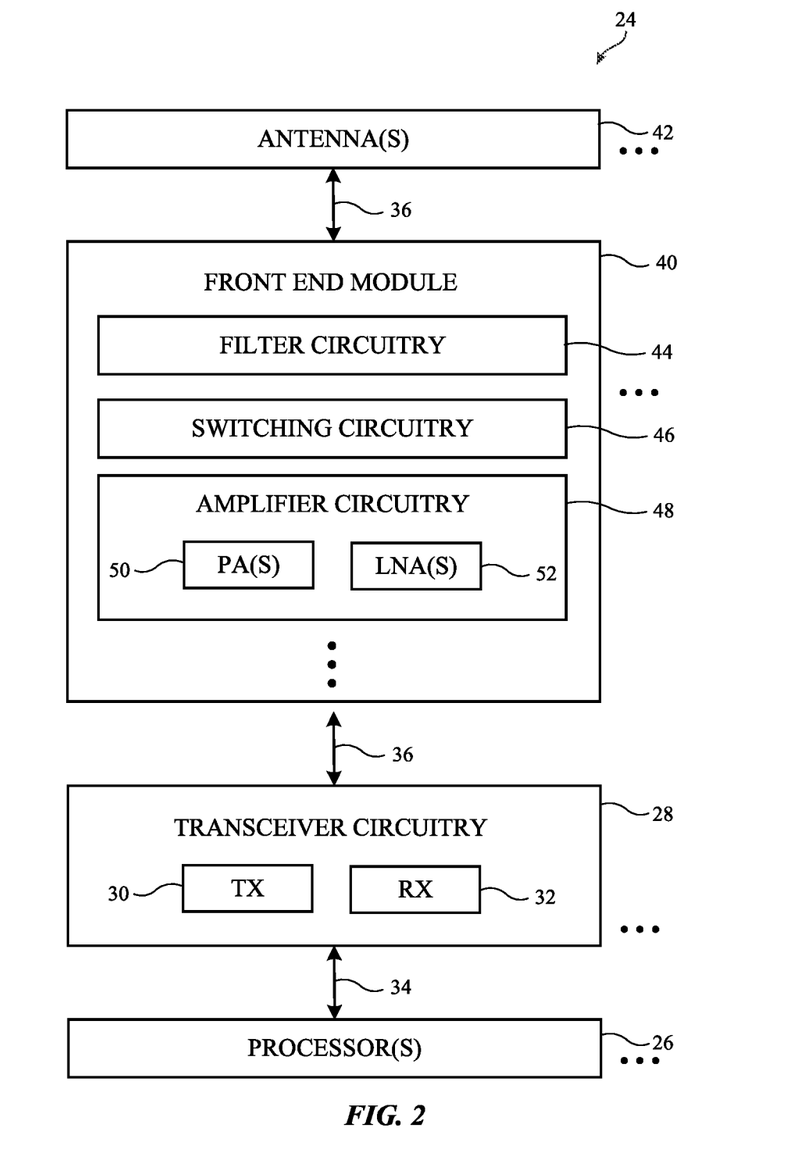
FIG. 2 is a diagram of illustrative wireless circuitry having amplifiers in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, application specific signal processing hardware, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 into corresponding radio-frequency signals. For example, transceiver circuitry 28 may include mixer circuitry for up-converting (or modulating) the transmit (baseband) signals to radio frequencies prior to transmission over antenna 42. The example of FIG. 2 in which processor 26 communicates with transceiver 28 is illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

Front end module (FEM) 40 may include radio-frequency front end circuitry that operates on the radio-frequency signals conveyed (transmitted and/or received) over radio-frequency transmission line path 36. FEM 40 may for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip. If desired, amplifier circuitry 48 and/or other components in front end 40 such as filter circuitry 44 may also be implemented as part of transceiver circuitry 28.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

As described above, front end module 40 may include one or more power amplifiers (PA) circuits 50 in the transmit (uplink) path. A power amplifier 50 (sometimes referred to as radio-frequency power amplifier, transmit amplifier, or amplifier) may be configured to amplify a radio-frequency signal without changing the signal shape, format, or modulation. Amplifier 50 may for example, be used to provide 10 dB of gain, 20 dB of gain, 10-20 dB of gain, less than 20 dB of gain, more than 20 dB of gain, or other suitable amounts of gain.

It can be challenging to design a satisfactory radio-frequency power amplifier for an electronic device. In general, a radio-frequency amplifier is most efficient when it is operating in compression (i.e., when an increase in the input power results in a non-linear change in the output power of the amplifier, which typically occurs at the higher range of input power levels). Conventional radio-frequency power amplifiers that receive a fixed power supply voltage will become less efficient when the amplifier operates at lower input power levels.

In an effort to address this reduction in efficiency, an envelope tracking technique has been developed where the power supply voltage of the radio-frequency power amplifier is continuously adjusted such that the gain of the power amplifier remains constant over varying signal amplitudes (sometimes referred to as iso-gain operation). Other gain shaping strategies such as iso-compression operation, predefined gain-over-power characteristic, etc. are possible as well. As an example, an envelope tracking system can generate a variable power supply voltage using a static linear transformation of the absolute value of a baseband signal from which the radio-frequency signals are generated. Ideally, the variably power supply perfectly tracks the envelope of the radio-frequency signal over time. In practice, however, there may be some delay or temporal (timing) misalignment between the two signal paths conveying the radio-frequency signal and the variably power supply voltage to the inputs of the radio-frequency power amplifier. If care is not taken, such timing misalignment between different signal paths to the radio-frequency amplifier can lead to unwanted gain values and signal distortion.

Figure 3:
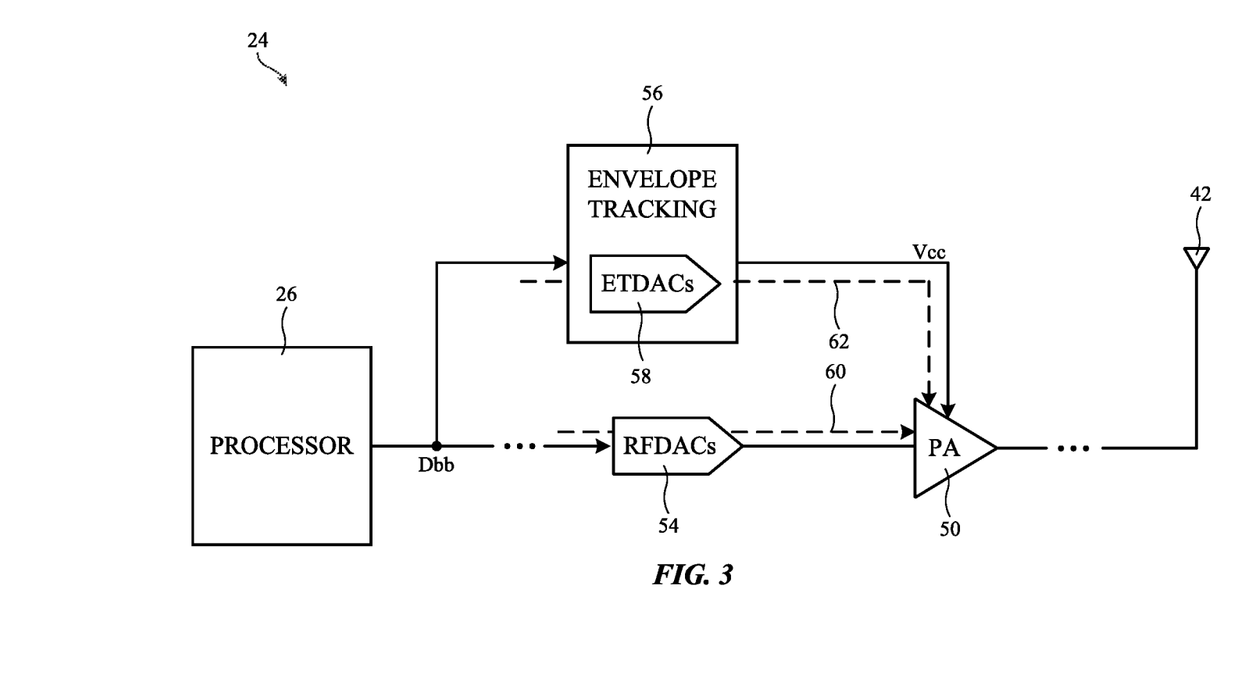
FIG. 3 is a diagram of illustrative envelope tracking circuitry for controlling a power supply voltage for a radio-frequency amplifier in accordance with some embodiments.

FIG. 3 is a diagram of illustrative wireless circuitry 24 having multiple signal paths to radio-frequency amplifier 50. As shown in FIG. 3, wireless circuitry 24 may include processor 26, a radio-frequency converter block such as radio-frequency converter block 54, a radio-frequency power amplifier such as radio-frequency amplifier 50, and an antenna 42 configured to radiate radio-frequency signals output from amplifier 50. Processor 26 may represent one or more processors such as a baseband processor, an application processor, a digital signal processor, a microcontroller, a microprocessor, a central processing unit (CPU), a programmable device, a combination of these circuits, and/or one or more processors within circuitry 18. Processor 26 may be configured to generate a digital baseband signal Dbb. Signal Dbb is sometimes referred to as a digital signal or a transmit signal. As examples, signal BB generated by processor 26 may include in-phase (I) and quadrature-phase (Q) signals, radius and phase signals, a vector input, or other digitally coded signals.

Radio-frequency converter block 54 may be configured to convert the digital baseband signals Dbb from the digital domain to the analog domain and to upconvert (modulate) the analog signals to radio frequencies. The term "radio-frequency converter" may thus refer to or be defined herein as a circuit that can perform both signal domain conversion (e.g., digital to analog conversion) and frequency upconversion (e.g., from baseband frequencies to radio frequencies or intermediate frequencies). Baseband frequencies can range from a couple hundred Hz to a couple hundred MHz. The input of amplifier 50 configured to receive radio-frequency signals can be referred to or defined herein as a radio-frequency input (port). Radio frequencies can range from hundreds of MHz to tens of GHz. RF converter block 54 may output a radio-frequency signal to the radio-frequency input of amplifier 50. Radio-frequency amplifier 50 may generate a corresponding amplified radio-frequency signal that can then be radiated by antenna(s) 42.

The example described above in which converter block 54 performs digital-to-analog conversion before conducting frequency upconversion in the analog domain is illustrative. In another embodiment, RF converter block 54 can perform frequency upconversion in the digital domain before conducting digital-to-analog conversion. In general, RF converter block 54 may include a plurality of N individual digital-to-analog converters, each of which is sometimes referred to or defined herein as a radio-frequency DAC ("RFDAC") or RFDAC cell (e.g., converter block 54 can include N separate radio-frequency DACs).

Wireless circuitry 24 may also include an envelope tracking (ET) subsystem such as envelope tracking circuitry 56 configured to receive baseband signal Dbb and to continuously adjust a supply voltage of radio-frequency amplifier 50 to ensure that amplifier 50 is always operating at peak efficiency. As shown in FIG. 3, envelope tracking circuitry 56 may be configured to generate a variable power supply voltage Vcc using a static linear transformation of the absolute value of baseband signal Dbb', using a non-linearity estimator (e.g., an amplifier non-linearity estimator that models a non-linear behavior of amplifier 50), using an amplifier load response estimator (e.g., an amplifier load response estimator that implements a baseband model of a frequency-dependent response of a load at the output of amplifier 50), and/or using other circuitry that can dynamically tune the amplifier power supply voltage Vcc.

Power supply voltage Vcc is fed to a power supply terminal of amplifier 50. The power supply terminal of amplifier 50 that receives Vcc from envelope tracking circuitry 66 can sometimes be referred to as a control input of amplifier 50. Tunable power supply voltage Vcc can therefore sometimes be referred to and defined herein as a control signal. Thus, envelope tracking circuitry 66 can sometimes be referred to generally as a control signal generator. To generate the desired amplifier supply voltage Vcc, envelope tracking circuitry 56 may also include a converter block such as envelope tracking converter block 58. Converter block 58 may include a plurality of M individual digital-to-analog converters, each of which is sometimes referred to as an envelope tracking DAC ("ETDAC") or ETDAC cell (e.g., converter block 58 can include M separate envelope tracking DACs).

In the example of FIG. 3, a first signal path such as signal path 60 leading to the radio-frequency input of amplifier 50 can include a first set of DACs (e.g., a group of N radio-frequency DACs in converter block 54), whereas a second signal path such as signal path 62 leading to the control input of amplifier 50 can include a second set of DACs (e.g., a group of M envelope tracking DACs in converter block 58). N can be any integer greater than four, four to ten, greater than 10, 10 to 20, greater than 20, or other integer value. M can be any integer less than ten, less than five, less than N, greater than N, equal to N, one to five, five to ten, less than 20, or other integer value. Any one of the N radio-frequency DACs in block 54 can be paired with any one of the M envelope tracking DACs in block 58 (e.g., the radio-frequency DACs and the envelope tracking DACs can be arbitrarily mixed or paired together for operation in different radio-frequency band groups). It is also possible that not any radio-frequency DAC in block 54 can be paired with any envelope tracking DAC in block 58. In other embodiments, a first subset of the radio-frequency DACs in block 54 can be paired with a first subset of envelope tracking DACs in block 58 while a second subset of the radio-frequency DACs in block 54 is paired with a second subset of envelope tracking DACs in block 58.

Ideally, envelope tracking circuitry 66 tunes supply voltage Vcc by perfectly tracking the envelope of the radio-frequency signal arriving at amplifier 50. To accomplish this, the delay or timing alignment between the signals traveling over paths 60 and 62 should be stable within a target timing tolerance. If desired, calibration operations can be employed to mitigate undesired delay between signal paths 60 and 62 that might arise from processing variations during the semiconductor manufacturing process. In practice, however, temperate, voltage, and/or other variations in operating condition can cause timing misalignment between signals output from the radio-frequency DACs and the envelope tracking DACs (e.g., resulting in delay inaccuracies between signal paths 60 and 62), which can degrade the performance of radio-frequency amplifier 50.

Figure 4:
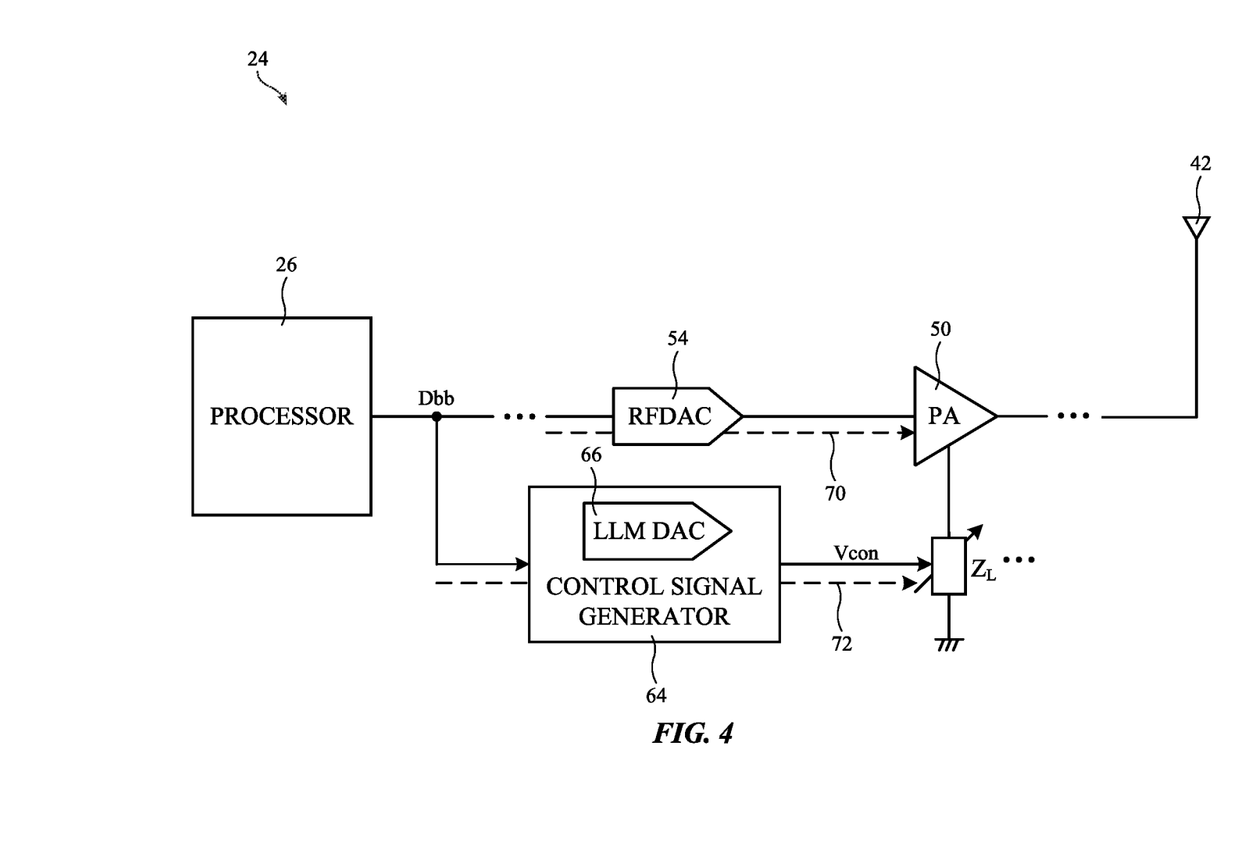
FIG. 4 is a diagram of an illustrative control signal generator for tuning an adjustable load component of a load-line modulated (LLM) radio-frequency amplifier in accordance with some embodiments.

The embodiment of FIG. 3 showing an envelope tracking based subsystem for tuning amplifier power supply voltage Vcc is exemplary and not intended to limit the scope of the present embodiments. FIG. 4 shows another embodiment in which radio-frequency amplifier 50 is a load modulated amplifier 50. Instead of the amplifier being tuned via the power supply voltage, amplifier 50 is tuned via an adjustable load component $Z_L$. Such type of radio-frequency power amplifier can be referred to and defined herein as a load-line modulated (LLM) radio-frequency amplifier 50. Adjustable load component $Z_L$ can have a load impedance that is tuned to provide amplifier 50 with different gain profiles. Adjustable load component $Z_L$ can generally represent one or more adjustable capacitance, one or more adjustable resistance, one or more adjustable inductance, other passive or active electronic component(s), a combination of these components, or other tunable load element.

As shown in FIG. 4, wireless circuitry 24 may include an amplifier control signal generator such as control signal generator 64 configured to receive baseband signal Dbb and to output a corresponding control signal Vcon for adjusting the LLM amplifier load component $Z_L$. Control signal generator 64 may include an absolute value function generator, a signal shaping function, a linear or non-linear transformation function, a combination of these functions, or other signal conditioning function for outputting amplifier control signal Vcon. If desired, control signal generator 64 may also include a non-linearity estimator (e.g., an amplifier non-linearity estimator that models a non-linear behavior of amplifier 50), an amplifier load response estimator (e.g., an amplifier load response estimator that implements a baseband model of a frequency-dependent response of a load at the output of amplifier 50'), and/or other circuitry that can help tune component $Z_L$ for optimum performance and efficiency.

Control signal Vcon can be fed to a control terminal of amplifier 50. The control terminal of load-line modulated amplifier 50 that receives Vcon from control signal generator 64 is sometimes referred to as a control input of LLM amplifier 50. To generate the desired control signal Vcon, control signal generator 64 may also include a converter block such as load-line modulation (LLM) converter block 66. Converter block 66 may include a plurality of M individual digital-to-analog converters, each of which is sometimes referred to as a load-line modulation DAC ("LLMDAC") or LLMDAC cell (e.g., converter block 66 can include M separate load modulation DACs).

In the example of FIG. 4, a first signal path such as signal path 70 leading to the radio-frequency input of amplifier 50 can include a first set of DACs (e.g., a group of N radio-frequency DACs in converter block 54), whereas a second signal path such as signal path 72 conveying control signal Vcon to the control input of amplifier 50 can include a second set of DACs (e.g., a group of M load-line modulation DACs in converter block 66). Ideally, the delay or timing alignment between the signals traveling over paths 70 and 72 should be stable within a target timing tolerance. If desired, calibration operations can be employed to mitigate undesired delay between signal paths 70 and 72 that might arise from processing variations during the semiconductor manufacturing process. In practice, however, temperate, voltage, and/or other variations in operating condition can cause timing misalignment between signals output from the radio-frequency DACs and the load-line modulation DACs (e.g., resulting in delay inaccuracies between signal paths 70 and 72), which can degrade the performance of radio-frequency amplifier 50.

Figure 5:
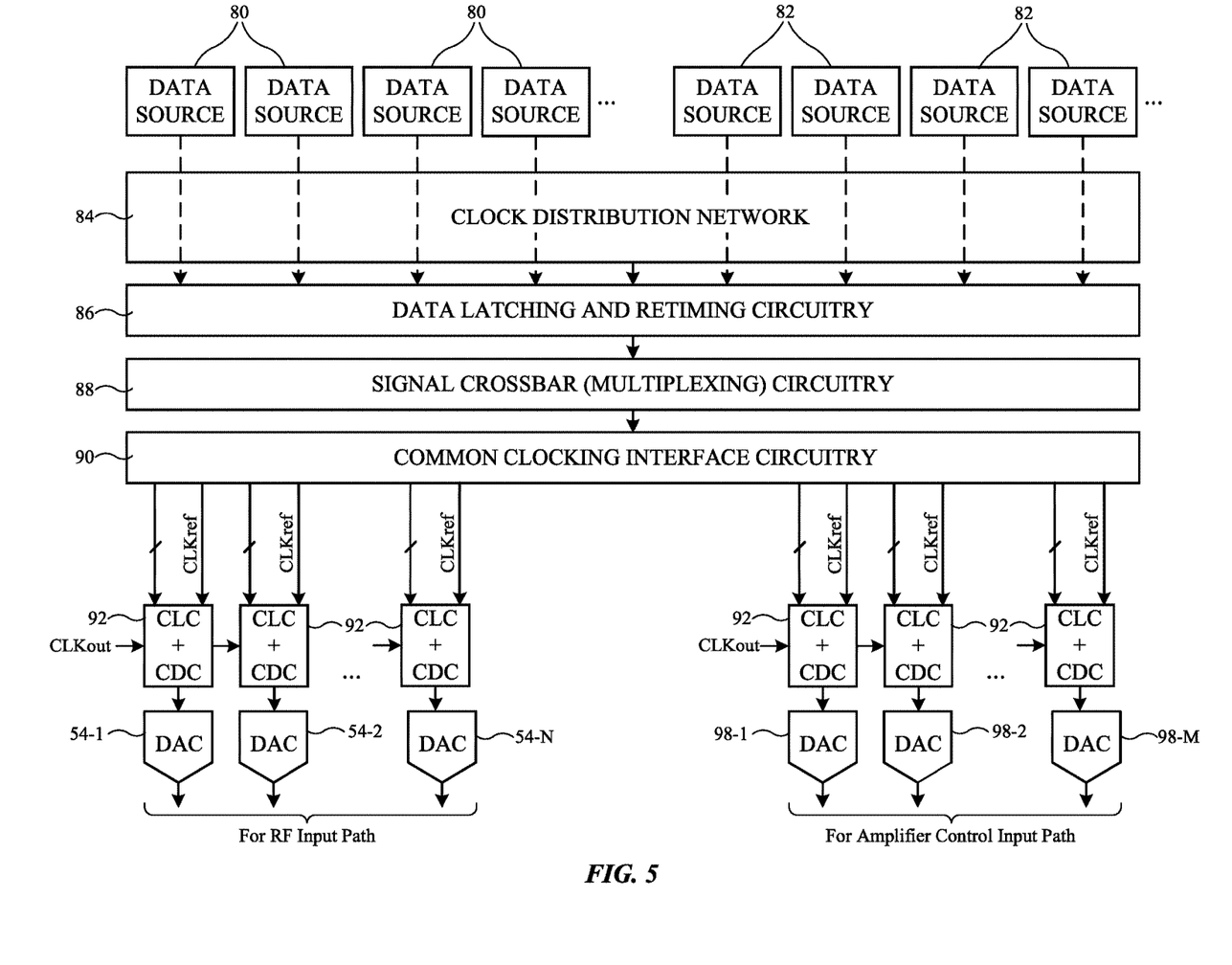
FIG. 5 is a diagram showing illustrative circuitry configured to time align multiple data streams for at least first and second amplifier inputs of a radio-frequency amplifier in accordance with some embodiments.

In accordance with an embodiment, FIG. 5 shows how wireless circuitry 24 can be provided with circuitry configured to ensure proper timing alignment multiple data streams being conveyed to the radio-frequency input and the control input of amplifier 50 even in the presence of temperature and voltage variations. As shown in FIG. 5, signals intended for the radio-frequency input path (see, e.g., signal path 60 of FIG. 3 and signal path 70 of FIG. 4) can be generated using a first set (group) of data sources 80, whereas signals intended for the amplifier control input path (see, e.g., signal path 62 of FIG. 3 and signal path 72 of FIG. 4) can be generated using a second set (group) of data sources 82. Each data source 80 or 82 can represent a digital signal processor outputting its own digital data stream from different chip partitions of one or more processor(s) 26.

The data streams output from data sources 80 and 82 can be fed to data latching and retiming circuitry 86. Circuitry 86 can include data latches for receiving and temporarily storing the digital data from the various data sources while also receiving clocks signals through a clock distribution network such as clock distribution network 84. Clock distribution network 84 may include multiple different clock trees for conveying clock signals to control the different data latches within circuitry 86. Circuitry 86 can also include retiming circuits that are configured to collect the various data streams output from the various data latches while ensuring that the data streams generated at the output of the retiming circuits are reasonably time aligned. A "reasonable" timing alignment, in the digital sense, can refer to a relatively coarse amount of data skew that still allows the various data streams output from circuitry 86 to be captured by a subsequent digital flip-flop or register in the RF input path and/or the amplifier control input path. Circuitry 86 receiving data streams from data sources 80 and 82 and clock signals from clock distribution network 84 can sometimes be referred to collectively as a latching and retiming layer.

Coarsely retimed data streams output from data latching and retiming circuitry 86 can be conveyed to switching circuitry such as signal crossbar (multiplexing) circuitry 88. Signal crossbar circuitry 88 can include one or more multiplexers for selectively passing on or outputting a portion of the retimed data streams. Signal crossbar circuitry 88 is therefore sometimes referred to as a signal crossbar or multiplexing layer.

As described above, the data streams propagating towards the radio-frequency DACs in the radio-frequency input path and the data streams propagating towards the ET or LLM DACs in the amplifier control input path should be sufficiently time aligned to ensure optimal performance of amplifier 50. The actual amount of delay drift in both DAC chains (signal paths) is not critical as long as the delays of both signal paths shift together by the same amount. To synchronize the delay shift seen at the DACs of the different amplifier signal paths, a common clocking interface such as common clocking interface circuitry 90 can be coupled at the output of signal crossbar circuitry 88. Common clocking interface circuitry 90 can include a layer of digital registers all controlled by a common reference clock. The reference clock can be output from a shallow clock tree (e.g., a clock tree having a clock tree depth of less than five levels) such that the reference clock represents a relatively low skew reference clock signal. Controlling the digital registers within interface circuitry 90 with a common (shared) low skew reference clock can help ensure that the delays of the different DAC chains are sufficiently matched. Common clocking interface circuitry 90 is sometimes referred to herein as a common clock interface layer or an interface clocking layer.

Still referring to FIG. 5, a first set (group) of constant latency control (CLC) and clock domain crossing (CDC) circuits 92 can be interposed between common clocking interface layer 90 and the N radio-frequency DACs (see DACs 54-1, 54-2, . . ., and 54-N) in the radio-frequency input path. Similarly, a second set (group) of constant latency control (CLC) and clock domain crossing (CDC) circuits 92 can be interposed between common clocking interface layer 90 and the M DACs (see DACs 98-1, 98-2, . . ., and 98-M) in the amplifier control input path. Digital-to-analog converters 98 can represent the envelope tracking DACs in block 58 of FIG. 3, the load-line modulation DACs in block 66 of FIG. 4, or other DACs in some other control input signal path associated with amplifier 50. Each CLC and CDC circuit 92 can include a constant latency control (sub)circuit and/or a clock domain cross (sub)circuit.

Each CLC and CDC circuit 92 can receive a latched data stream and the low skew reference clock signal (see CLKref) from common clocking interface circuitry 90 and can also receive an output clock signal CLKout. Output clock signal CLKout is sometimes referred to as a radio-frequency clock signal (RFCLK). As its name suggests, CLC and CDC circuit 92 may be a closed loop control circuit that translates its arriving data from one clock domain (the domain of CLKref) to another different clock domain (the domain of CLKout) without introducing any delay uncertainty such as synchronization delay uncertainty (e.g., while guaranteeing a constant latency or delay across each circuit 92). In other words, the latency across each CLC and CDC circuit 92 is fixed to some static or adjustable delay value. The delay across circuit 92 does not depend on the frequency of the output clock CLKout. The delay across circuit 92 also does not depend on the phase of the output clock CLKout. Circuit 92 may be configured to generate an interpolated output signal using the output clock signal CLKout. Output clock signal CLKout may be delayed by a constant time offset with respect to the reference clock signal CLKref. In other words, the constant time offset is independent of the frequency and phase of the output clock signal CLKout. The data streams output from the N separate CLC and CDC circuits 92 can finally arrive, timed aligned, at the radio-frequency DACs in the radio-frequency input path. Similarly, the data streams output from the M separate CLC and CDC circuits 92 can finally arrive, time aligned, at DACs 98 in the amplifier control input path.

Figure 6:
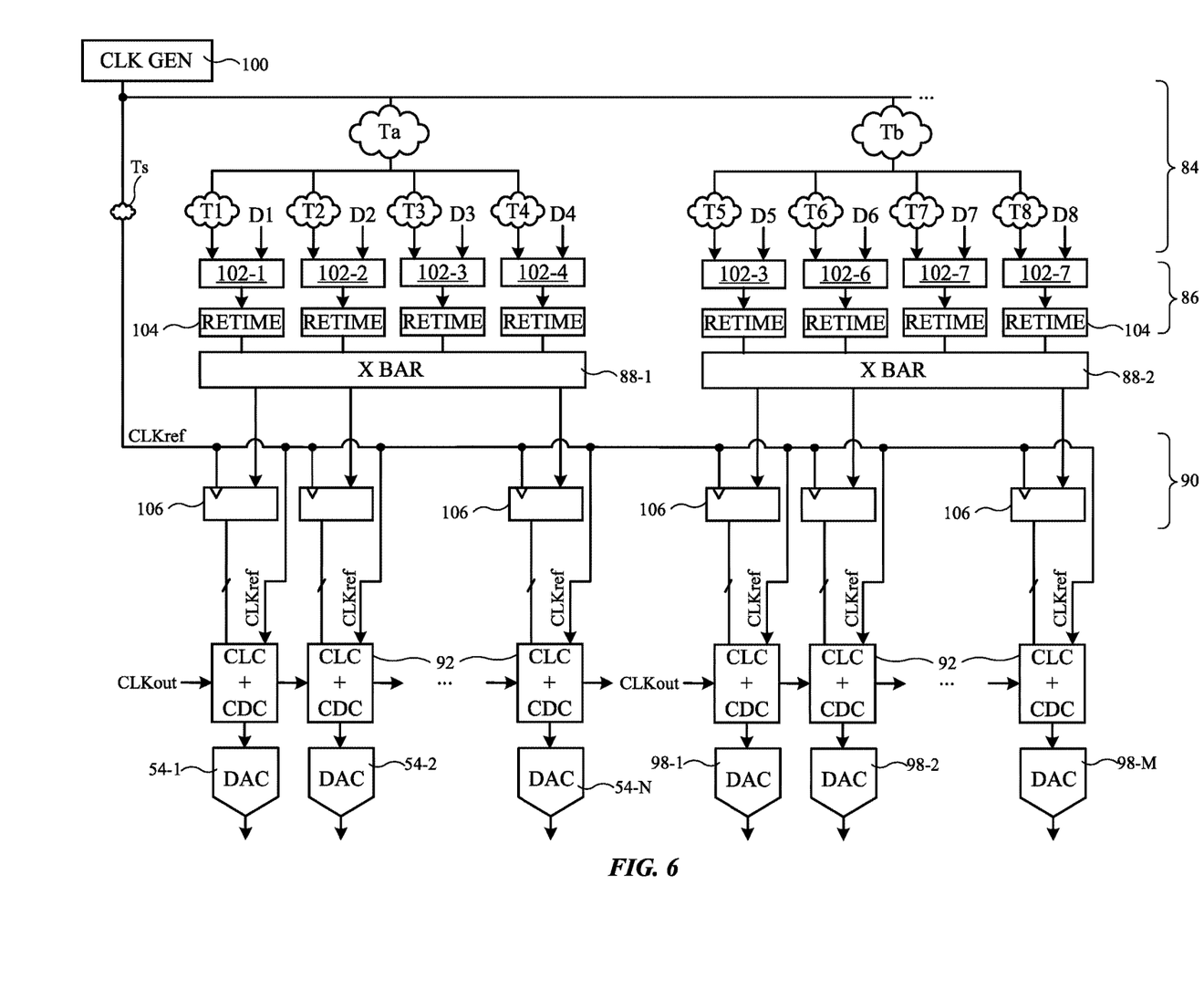
FIG. 6 is a diagram showing illustrative common interface circuitry for conveying a low skew reference clock signal for clocking data streams being fed to a first set of data converters associated with the first amplifier and for clocking data streams being fed to a second set of data converters associated with the second amplifier input in accordance with some embodiments.

FIG. 6 is a diagram showing a more detailed exemplary implementation of the system architecture shown in FIG. 5. As shown in FIG. 6, clock distribution network 84 may receive a clock source from a clock generator such as clock generator 100 and may include various clock trees for distributing the clock source to corresponding data latches in the data latching layer. Clock generator 100 may be implemented as a phase-locked loop, may include a crystal oscillator, or may include other on-chip or external oscillator component.

Clock distribution network 84 may include a clock tree Ta configured to distribute the clock source to a first data latch 102-1 for latching data stream D1 output from a first digital data source 80 (see FIG. 5), to a second data latch 102-2 for latching data stream D2 output from a second digital data source 80, to a third data latch 102-3 for latching data stream D3 output from a third digital data source 80, and to a fourth data latch 102-4 for latching data stream D4 output from a fourth digital data source 80. Clock tree Ta may exhibit any desired clock tree depth (e.g., clock tree Ta can include two or more clock buffer stages, two to ten clock buffer stages, 10-50 clock buffer stages, 50-100 clock buffer stages, or more than 100 clock buffer stages). Clock trees T1-T4 may exhibit the same or different clock tree depths, each having two or more clock buffer stages, two to ten clock buffer stages, 10-50 clock buffer stages, 50-100 clock buffer stages, or more than 100 clock buffer stages. The example of FIG. 6 in which clock tree Ta is coupled to four corresponding data latches 102-1, 102-2, 102-3, and 102-4 is illustrative. In other embodiments, root clock tree Ta can be configured to feed the clock source to more than four data latches, four to ten data latches, 10-100 data latches, or more than 100 data latches associated with latching data streams intended for the radio-frequency DACs along the radio-frequency input path.

Clock distribution network 84 may also include a clock tree Tb configured to distribute the clock source to a fifth data latch 102-5 for latching data stream D5 output from a fifth digital data source 82 (see FIG. 5), to a sixth data latch 102-6 for latching data stream D6 output from a sixth digital data source 82, to a seventh data latch 102-7 for latching data stream D7 output from a seventh digital data source 82, and to an eighth data latch 102-8 for latching data stream D8 output from an eighth digital data source 82. Clock tree Tb may exhibit any desired clock tree depth. Clock trees T5-T8 may exhibit the same or different clock tree depths, each having two or more clock buffer stages, two to ten clock buffer stages, 10-50 clock buffer stages, 50-100 clock buffer stages, or more than 100 clock buffer stages. The example of FIG. 6 in which clock tree Tb is coupled to four corresponding data latches 102-5, 102-6, 102-7, and 102-8 is illustrative. In other embodiments, root clock tree Tb can be configured to feed the clock source to more than four data latches, four to ten data latches, 10-100 data latches, or more than 100 data latches associated with latching data streams intended for the envelope tracking or load-line modulation DACs along the amplifier control input path.

Data latches 102-1, 102-2, 102-3, and 102-4 may output respective data streams to a first group of retiming circuits 104. The first group of retiming circuits 104 are configured to shift the latched data streams into a valid setup-hold window of the corresponding digital registers within interface circuitry 90. A first crossbar circuit 88-1 can receive the retimed data streams from the first group of retiming circuits 104 and pass on (multiplex) selected data streams to interface circuitry 90.

Similarly, data latches 102-5, 102-6, 102-7, and 102-8 may output respective data streams to a second group of retiming circuits 104. The second group of retiming circuits 104 are configured to shift the latched data streams into a valid setup-hold window of the corresponding digital registers within interface circuitry 90. A second crossbar circuit 88-2 can receive the retimed data streams from the second group of retiming circuits 104 and pass on (multiplex)

selected data streams to interface circuitry 90. Crossbar circuits 88-1 and 88-2 are considered part of the signal crossbar/multiplexing layer.

Common clocking interface circuitry 90 can include a first group of interface registers 106 configured to receive data signals from first crossbar circuit 88-1 and can include a second group of interface registers 106 configured to receive data signals from second crossbar circuit 88-2. As shown in FIG. 6, clocking interface circuitry 90 may include only a single layer of registers 106. Each of the interface registers 106 in circuitry 90 can receive reference clock signal CLKref from a shallow clock tree Ts. Clock tree Ts can receive the clock source from clock signal generator 100 and can exhibit a limited or relatively shallow clock tree depth (e.g., clock tree Ts can include fewer clock buffer stages than Ta, T1, T2, T3, or T4, fewer clock buffer stages than Tb, T5, T6, T7, or T8, only two to three clock buffer stages, one to four clock buffer stages, less than five clock buffer stages, less than seven clock buffer stages, or less than ten clock buffer stages). Configured in this way, reference clock signal CLKref that is used to latch interface registers 106 will exhibit ultra-low clock skew or substantially less clock skew relative to the clock trees within the deeper clock distribution network 84.

The first group of interface registers 106 can output corresponding data streams to a first group of constant latency control (CLC) and clock domain crossing (CDC) circuits 92, whereas the second group of interface registers 106 can output corresponding data streams to a second group of CLC and CDC circuits 92. Each CLC and CDC circuit 92 can also receive reference clock signal CLKref forwarded from the common clocking interface circuitry 90 and output clock signal CLKout. As its name suggests, CLC and CDC circuit 92 may be a closed loop control circuit configured to cross the data streams from a first clock domain associated with CLKref to a second clock domain associated with CLKout while guaranteeing a constant (fixed) latency or delay. Operated in this way, the arrival of data streams at the N radio-frequency DACs can be time aligned with the arrival of data streams at the M DACs 98. This tight timing accuracy can be achieved via the use of the common (shared) clocking interface layer 90 in conjunction with the closed loop CLC and CDC circuits 92.

Figure 7:
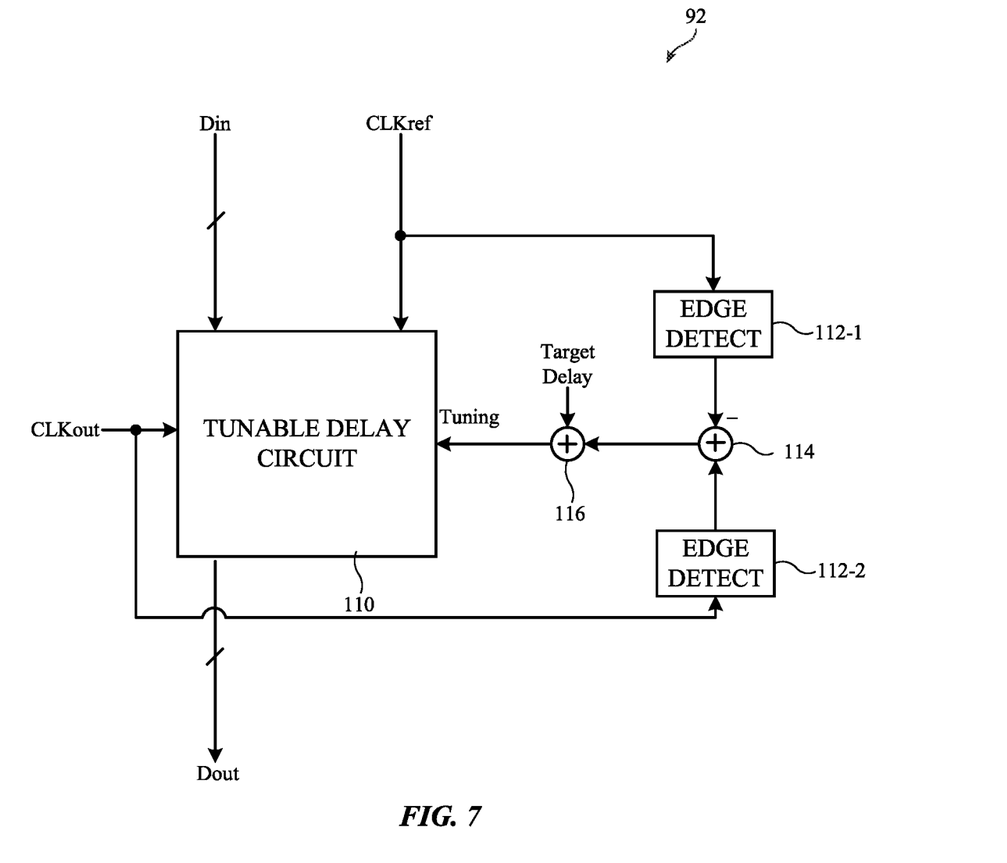
FIG. 7 is a diagram of an illustrative constant latency control (CLC) and clock domain crossing (CDC) circuit in accordance with some embodiments.

FIG. 7 is a diagram showing an illustrative implementation of constant latency control (CLC) and clock domain crossing (CDC) circuit 92. As shown in FIG. 7, circuit 92 can include a tunable delay circuit 110, a first edge detection circuit 112-1, a second edge detection circuit 112-2, a first adder circuit 114, and a second adder circuit 116. Tunable delay circuit 110 may include at least a first input configured to receive a digital data stream Din from an interface register in circuitry 90 (see FIG. 6), a second input configured to receive reference clock signal CLKref, a third input configured to receive output clock signal CLKout, and an output on which a corresponding output data stream Dout is provided to a corresponding DAC cell. The first edge detection circuit 112-1 can be used to detect the arrival time of signal CLKref (e.g., to detect rising or falling edges of the reference clock signal). The second edge detection circuit 112-2 can be used to detect the arrival time of signal CLKout (e.g., to detect rising or falling edges of the output clock signal).

The first adder circuit 114 can be used to compare the arrival time of CLKref and CLKout (e.g., by computing the difference between the outputs of edge detectors 112-1 and 112-2). Adder circuit 114 is therefore sometimes referred to as a subtraction circuit. The second adder circuit 116 can be configured to add the difference value output from circuit 114 with a target delay value to generate a corresponding tuning value for adjusting the delay of circuit 110. Configured in this way, CLC and CDC circuit 92 operates as a closed loop control circuit that steers the clock domain crossing such that the latency referenced to clock signal CLKref is fixed. The configuration of CLC and CDC circuit 92 as shown in FIG. 7 is exemplary. If desired, other ways of implementing constant latency control and/or clock domain crossing functions can be employed.

The methods and operations described above in connection with FIGS. 1-7 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is exemplary and various modifications can be made to the described embodiments. The foregoing embodiments may be implemented individually or in any combination.

What is claimed is:

1. Circuitry comprising:
   a first digital-to-analog converter (DAC);
   a second digital-to-analog converter (DAC);
   a first data latch configured to receive a first data stream and to receive a first clock signal via a first clock tree;
   a second data latch configured to receive a second data stream and to receive a second clock signal via a second clock tree;
   clocking interface circuitry coupled between the first data latch and the first DAC and coupled between the second data latch and the second DAC, the clocking interface circuitry having a plurality of registers each of which is configured to receive a reference clock signal;
   a first constant latency control (CLC) and clock domain crossing (CDC) circuit coupled between the clocking interface circuitry and the first DAC; and
   a second constant latency control (CLC) and clock domain crossing (CDC) circuit coupled between the clocking interface circuitry and the second DAC.

2. The circuitry of claim 1, further comprising:
   a radio-frequency amplifier having a radio-frequency input coupled to the first DAC and having a control input coupled to the second DAC.

3. The circuitry of claim 2, wherein the second DAC is part of envelope tracking circuitry configured to output a variable power supply voltage to the control input of the radio-frequency amplifier.

4. The circuitry of claim 2, wherein the second DAC is part of a control signal generator configured to output a control signal to an adjustable load component of the radio-frequency amplifier.

5. The circuitry of claim 1, further comprising:
a clock generator configured to generate a clock source; and
a third clock tree configured to receive the clock source and to output the reference clock signal to the clocking interface circuitry, the third clock tree having fewer clock buffer stages than the first clock tree and having fewer clock buffer stages than the second clock tree.

6. The circuitry of claim 1, wherein:
the first DAC comprises a digital-to-analog converter in a first group of digital-to-analog converters (DACs);
the second DAC comprises a digital-to-analog converter in a second group of digital-to-analog converters (DACs);
the first data latch comprises a data latch in a first group of data latches configured to receive data from first data sources; and
the second data latch comprises a data latch in a second group of data latches configured to receive data from second data sources.

7. The circuitry of claim 6, further comprising:
first clock trees configured to route clock signals to the first group of data latches; and
second clock trees configured to route clock signals to the second group of data latches.

8. The circuitry of claim 6, further comprising:
a first group of retiming circuits coupled between the first group of data latches and the clocking interface circuitry; and
a second group of retiming circuits coupled between the second group of data latches and the clocking interface circuitry.

9. The circuitry of claim 8, further comprising:
a first multiplexing circuit coupled between the first group of retiming circuits and the clocking interface circuitry; and
a second multiplexing circuit coupled between the second group of retiming circuits and the clocking interface circuitry.

10. The circuitry of claim 1, wherein the first CLC and CDC circuit is configured to:
receive the reference clock signal from the clocking interface circuitry;
receive the first data stream from one of the registers in the clocking interface circuitry; and
generate an interpolated output signal using an output clock signal that is delayed by a constant time offset with respect to the reference clock signal.

11. The circuitry of claim 10, wherein the constant time offset is independent of a frequency and phase of the output clock signal.

12. The circuitry of claim 11, wherein the first CLC and CDC circuit comprises:
a tunable delay circuit having a first input configured to receive the reference clock signal and having a second input configured to receive the output clock signal.

13. The circuitry of claim 12, wherein the first CLC and CDC circuit further comprises:
a first edge detection circuit configured to detect a rising or falling edge in the reference clock signal; and
a second edge detection circuit configured to detect a rising or falling edge in the output clock signal.

14. The circuitry of claim 13, wherein the first CLC and CDC circuit further comprises:
a subtraction circuit having inputs coupled to the first and second edge detection circuits; and
an additional circuit having a first input coupled to the subtraction circuit, a second input configured to receive a delay value, and an output coupled to the tunable delay circuit.

15. Wireless circuitry comprising:
a radio-frequency amplifier;
a first digital-to-analog converter (DAC) coupled to a first input of the radio-frequency amplifier;
a second digital-to-analog converter (DAC) coupled to a second input of the radio-frequency amplifier;
a first constant latency control (CLC) subcircuit coupled to an input of the first DAC; and
a second constant latency control (CLC) subcircuit coupled to an input of the second DAC.

16. The wireless circuitry of claim 15, further comprising:
a first clock domain crossing (CDC) subcircuit coupled to the first CLC subcircuit; and
a second clock domain crossing (CDC) subcircuit coupled to the second CLC subcircuit.

17. The wireless circuitry of claim 15, further comprising:
a layer of registers controlled by a reference clock signal and having outputs coupled to the first and second CLC subcircuits, wherein the first and second CLC subcircuits are configured to receive the reference clock signal.

18. The wireless circuitry of claim 17, further comprising:
a first crossbar circuit coupled to a first portion of the registers;
a second crossbar circuit coupled to a second portion of the registers; and
a clock tree configured to output the reference clock signal to the layer of registers.

19. Wireless circuitry comprising:
a first group of data sources;
a second group of data sources;
data latching and retiming circuitry configured to receive first data streams from the first group of data sources and to receive second data streams from the second group of data sources;
multiplexing circuitry configured to receive signals from the data latching and retiming circuitry;
a layer of registers configured to receive signals from the multiplexing circuitry and a reference clock signal;
a first group of constant latency control (CLC) and clock domain crossing (CDC) circuits configured to receive; signals from a first portion of the registers, the reference clock signal, and an output clock signal; and
a second group of constant latency control (CLC) and clock domain crossing (CDC) circuits configured to receive; signals from a second portion of the registers, the reference clock signal, and the output clock signal.

20. The wireless circuitry of claim 19, further comprising:
an amplifier;
a first group of digital-to-analog converters (DACs) coupled to the first group of CLC and CDC circuits and coupled to a radio-frequency input of the amplifier; and
a second group of digital-to-analog converters (DACs) coupled to the second group of CLC and CDC circuits and coupled to a control input of the amplifier.

* * * * *